United States Patent [19]

Forster et al.

[11] Patent Number: 5,653,379

[45] Date of Patent: Aug. 5, 1997

[54] CLAD METAL SUBSTRATE

[75] Inventors: James Forster, Barrington, R.I.; Premkumar Hingorany, Foxboro; Henry F. Breit, Attleboro, both of Mass.

[73] Assignee: Texas Instruments Incorporated, Dallas, Tex.

[21] Appl. No.: 459,440

[22] Filed: Jun. 2, 1995

(Under 37 CFR 1.47)

Related U.S. Application Data

[62] Division of Ser. No. 985,545, Dec. 4, 1992, which is a continuation of Ser. No. 452,937, Dec. 18, 1989, abandoned.

[51] Int. Cl.$^6$ .............................. B23K 31/02; B23K 35/24
[52] U.S. Cl. .................................. 228/124.1; 228/122.1; 228/124.5
[58] Field of Search ................................ 228/124.5, 122.1, 228/208, 124.1

[56] References Cited

U.S. PATENT DOCUMENTS

| 3,744,120 | 7/1973 | Burgess et al. | |
|---|---|---|---|
| 3,766,634 | 10/1973 | Babcock et al. | |
| 3,854,892 | 12/1974 | Burgess et al. | |
| 3,911,553 | 10/1975 | Burgess et al. | |
| 3,993,411 | 11/1976 | Babcock et al. | |
| 3,994,430 | 11/1976 | Cusano et al. | |
| 4,129,243 | 12/1978 | Cusano et al. | |
| 4,568,586 | 2/1986 | Gobrecht . | |
| 4,611,745 | 9/1986 | Nakahashi et al. | 228/124.5 |
| 4,763,828 | 8/1988 | Fukaya et al. | 228/124.1 |
| 4,809,135 | 2/1989 | Yerman . | |
| 5,082,163 | 1/1992 | Kanahara et al. | 228/124.1 |

FOREIGN PATENT DOCUMENTS

| 545179 | 8/1957 | Canada | 228/124.1 |
|---|---|---|---|
| 784931 | 10/1957 | United Kingdom | 228/124.1 |

*Primary Examiner*—P. Austin Bradley
*Assistant Examiner*—Jeffrey T. Knapp
*Attorney, Agent, or Firm*—Russell E. Baumann; Richard L. Donaldson; René E. Grossman

[57] ABSTRACT

Ceramic to metal stock or substrates having a relatively large and thick metal core and a relatively thin ceramic layer or layers are bonded to the metal core or a selected portion thereof by providing a metal core material having a temperature coefficient of expansion which is tailored to the temperature coefficient of expansion of the ceramic layer to be bonded thereto. The typical core materials include multilayer composite metal laminates embodying Cu/Mo/Cu, Cu/Kovar/Cu, Cu/Invar/Cu and the like and including powdered metal composites embodying Cu-W, Ag-Mo, Ag-W, Al-Si, Cu/Mo/Cu, Cu/Kovar/Cu, SiC-Cu, Ni-Fe alloys having from about 20% Ni to about 80% Ni, etc. The ceramic layer is chosen primarily for the properties of dielectric strength and isolation properties and typically include such ceramics as alumina, beryllium oxide, aluminum nitride, silicon carbide, etc. Where the core composite includes copper outer surface materials or is plated to have copper outer surface materials, the core and ceramic materials and particularly multiple sections of the ceramic materials are provided in spaced relation on the metal cores of relatively large area and are preferably bonded to the core using a copper oxide eutectic formed on the core surface.

8 Claims, 2 Drawing Sheets

CLAD METAL SUBSTRATE

This application is a division, of application Ser. No. 07/985,545, filed Dec. 4, 1992 which is a continuation of Ser. No. 07/452,937 Dec. 18, 1989 now abandoned.

BACKGROUND OF THE INVENTION

1. Field of the Invention

This invention relates to a ceramic insulator coated metal and, more specifically, to a large and thick clad metal member bonded to a relatively thin electrically insulating ceramic material.

2. Brief Description of the Prior Art

Bonding of ceramic materials, such as alumina or the like to metal is generally known in the prior art. Examples of procedures for direct bonding of copper or other metals onto various ceramic materials is set forth, for example, in U.S. Pat. Nos. 3,744,120, 3,766,634, 3,854,892, 3,911,553, 3,993,411, 3,994,430 and 4,129,243, and an article in IEEE Transactions on Components, Hybrids and Manufacturing Technology entitled "Thick Film and Direct Bond Copper Forming Technologies for Aluminum Nitride Substrate" by Nobuo Iwase et al., June, 1985, the subject matter of all of which is incorporated herein by reference.

Where such systems for bonding ceramic and metal materials as described in the above noted patents have been proposed, they have suffered from the limitation that mismatch in the temperature coefficient of expansion (TCE) of ceramic (typically but not limited to alumina, beryllium oxide, aluminum nitride, etc.) and metal (typically copper or high thermal conductivity metals) does not permit relatively large or thick high thermal conductivity metals to be bonded to relatively thin ceramic insulating materials. As an example, the TCE of copper is 16 ppm/oC. whereas the TCE for alumina is 7 ppm/oC., this mismatch resulting in the application of great stresses to the materials with potential cracking of the ceramic material. Accordingly, in accordance with the prior art as exemplified by some of the above noted patents, in order to minimize this problem, the amount of metal proposed for use in conjunction with the ceramic in applications of the type described in the above noted patents is very small. Typically, not more than 0.010 inch copper foil is bonded onto a 0.025 inch thick or thicker alumina member and typically the area or size of the composite has been limited to avoid cracking of the alumina member. In such prior art systems, the core material is generally a relatively thick ceramic material having a metal layer thereon rather than a thick metal core material with the relatively thin layers of ceramic on one or both sides of the metal material.

It is desirable to provide a relatively thick metal (as opposed to the prior art thin metal) core having a relatively thin electrically insulating layer or layers (as opposed to the prior art thick electrically insulating layer) joined thereto in an economical and reliable way whereby the metal core provides the highly beneficial properties of good thermal conductivity by being a good heat sink for components disposed either on the insulating layer or on the metal core itself. This arrangement provides improved rigidity wherein a relatively thick breakable ceramic layer is no longer present, particularly where the metal core has a plurality of separate ceramic sections formed thereon and is capable of providing larger size substrates and wherein the insulating layer will be less subject to cracking due to relatively small thermal mismatch between the metal core and the ceramic layer.

SUMMARY OF THE INVENTION

In accordance with the present invention, there is provided a method of producing ceramic bonded to metal and preferable composite metal systems wherein the ceramic layer is thin relative to the metal core thickness, yet without cracking the ceramic layer or adversely affecting thermal expansion of the composite metal and ceramic layers. Composite metals include, but are not limited to, any combination of metals formed by cladding, powder metallurgy or metal matrix composites such that the composite metal material has controlled expansion and high thermal conductivity.

Briefly, the metal core is defined as any clad, laminated and/or powder metallurgically produced material of suitably high thermal conductivity whose coefficient of thermal expansion is pre-controlled to substantially match the coefficient of thermal expansion of the ceramic layer intended to be bonded to the metal core. characteristics are determined by the "Rule of Mixtures" and formula set forth by R. D. Delagi in "Designing with Clad Metals", Machine Design, Nov. 20, 1980. The thermal expansion of a laminate parallel to the surface is given by:

$$\text{laminate} = \alpha_1 + \frac{(\alpha_2 - \alpha_1) f_2 E_2}{F_2 E_2 + F_1 E_1}$$

where $\alpha_1$ and $\alpha_2$ are the coefficients of expansion $E_1$ and $E_2$ are the moduli of elasticity and $f_1$ and $f_2$ are the component thicknesses as a percentage of the total thickness.

For example, a laminate of copper clad invar with a thickness ratio of 20/60/20 with:

$\alpha$copper=$16.5 \times 10^{-6}$
$\alpha$invar=$1.6 \times 10^{-6}$
Ecopper=$17 \times 10^6$ psi
EInvar=$20.5 \times 10^6$ psi
$f_1$ copper=0.4
$f_2$ Invar=0.6 would have an expansion of $6.3 \times 10^{-6}$. Similar calculations can be made for copper clad molybdenum, copper clad alloy 42, etc. In all cases the ratio of the laminate can be tailored to provide a specific coefficient of thermal expansion.

Although the discussion has been focused upon laminate systems, the combination of materials could be produced using standard or conventional powder metallurgical processes. These would include coblends of a variety of powders which would then be pressed and sintered using techniques and processes known to those skilled in the art. A number of theoretical models are available to predict the performance of mixed powders, although all models must be verified by experiments which could lead to a change of mixtures to produce the desired properties. In any case, the combination of two or more materials in specific ratios will produce a composite material with an expansion which is between the values of the materials being combined.

Examples of such metal cores are Cu/Invar/Cu, Cu-W, Ag-Mo, Ag-W, Al/Invar/Al, Al/Invar, Al-Si, Cu/Mo/Cu, Cu/Kovar/Cu, Sic-Cu, Ni-Fe alloys having from about 20% Ni to about 80% Ni, etc. The core can be a laminate or a homogeneously mixed powder metallurgical system as shown in U.S. Pat. No. 4,546,406 or in the commonly assigned copending application Ser. No. 07/166,290, filed Mar. 10, 1988, now U.S. Pat. No. 4,894,293. If a powder metal material is used, the core surface is cleaned and coated by plating or cladding with a thin copper layer. The ceramic material is chosen for the properties of dielectric strength and isolation properties primarily. Typical such ceramics are alumina, beryllium oxide, aluminum nitride, silicon carbide, etc., with alumina being the presently preferred ceramic material due to the large existing body of technology extant for depositing electrical circuits onto alumina surfaces by thin film and thick film techniques.

The metal core is bonded to the ceramic by soldering, brazing, direct eutectic bond, adhesive bonding or any other technique where necessary steps have been taken to produce good wettability on the ceramic surface, some of the techniques which meet these requirements being set forth in the above noted patents.

The technique used will depend upon the application and the structure of the substrate material. For example, if the substrate is a composite of aluminum and invar in such ratio that the expansion characteristics are close to that of alumina, then pieces of alumina which have been prepared with the necessary circuitry and electronic conductive paths, etc. can be bonded using a thermally conductive epoxy, adhesive or solder. This adhesive can be electrically conductive and may be filled with silver, alumina or some other material for improved thermal characteristics.

In the case of eutectic formation, the eutectic is formed at a temperature below the melting temperature of the metal core. Brazing and soldering will also be performed below the melting point of the metal core. With the ability to bond the thin ceramic layer onto the metal core, it is then possible to utilize standard thin and/or thick film technology on the insulating layer by screen printing or the like to form electric circuits, etc.

The ratio of the thickness of the metal core to that of the insulator for an insulator/core/insulator system in accordance with the present invention would be 1:n:1 where n is a number equal to or greater than about one (1). The maximum thickness of the core is essentially unlimited and is a function of economics, space requirements and practicality. Generally, substrates as contemplated herein would have a total thickness in the vicinity of 0.010 inches though this dimension is not intended in any way to be a limitation on the invention herein. In some applications core thicknesses of ¼ inch and even thicker are contemplated. The preferred thickness ratio of insulator/core/insulator would be from about 1/3/1 to about 1/20/1. In the case of a non-symmetric combination of insulator and core, the thickness of insulator to core would be 1:n where n is a number equal to or greater than about one (1).

A substrate is produced in accordance with the present invention by providing the desired core material, preferably Cu/Invar/Cu, with the chemical formulation of the Invar having been adjusted so that the core as a whole has a coefficient of thermal expansion closely matching that of the contemplated ceramic material to be used, such procedures being known in the art. A layer of that ceramic material is then formed over the core material. This core-ceramic material is then processed in accordance with any of the procedures and in conjunction with the materials herein wherein as set forth, for example, in U.S. Pat. No. 3,993,411, a eutectic surface layer, preferably in the form of cuprous oxide or the like, having the properties of being stable, melting below the melting temperature of the remainder of the core material and wetting the core material is formed. The wetting agent must also have a melting point above the temperatures at which later operations in conjunction with the substrate will take place, such as, for example, thin or thick film operations. Upon the formation of the cuprous oxide by reaction of the copper with the oxygen in a reactor environment, a copper-cuprous oxide eutectic liquid is briefly formed to wet the copper and the ceramic material and provide a good bond therebetween.

A small amount of mismatch in the proper direction can be advantageous. If mismatch is such that the ceramic material goes under slight compression when cooled, then the result will be favorable. If the mismatch is such that the ceramic goes into tension, the ceramic may then fail and crack. This problem can be minimized by patterning the ceramic layer on the metal core so that only selected area layers of ceramic are present on the core. This arrangement will lessen the likelihood of the ceramic layer or layers being placed under too severe an amount of tension and cracking. The greater the mismatch, the smaller will be the size of the islands of ceramic if the possibly objectionable results of any shift mismatch are to be minimized.

Other advantages of controlled expansion metallic substrates are that they can be used as carriers for ceramic substrates to improve ceramic substrate thermal conductivity and rigidity and provide for disposition of plural ceramic substrates thereon wherein the ceramic substrates with electronics thereon are positioned on a single metal substrate with possible electrical interconnection between substrates.

In addition, the rigid metal core can provide the necessary rigidity so that the ceramic can be selectively machined to a thinner section in order to improve the thermal properties of the system by such reduction of the thickness of the thermal and electrical insulator. This machining can be performed over the entire insulator surface to provide a very thin ceramic coating or it can be performed selectively so that electronic devices can be placed in areas where the insulator thickness is significantly reduced. All of the selective machining is performed after all high temperature operations have been completed so that differences in the TCE will not lead to cracking of the ceramic.

DESCRIPTION OF THE PREFERRED EMBODIMENT

In accordance with the present invention, there is provided a core member comprising a composite metal such as Cu/Invar/Cu, Cu-W, Ag-Mo, Ag-W, Al/Invar/Al, Al/Invar, Al-Si, Cu/Mo/Cu, Cu/Kovar/Cu, SiC-Cu, Ni-Fe alloys having from about 20% Ni to about 80% Ni, etc. The core can be a laminate or a homogeneously mixed powder metallurgical system. A relatively thin layer of ceramic material having a coefficient of thermal expansion substantially the same as the core is then joined to the core to provide the final substrate. Processing on the ceramic layer can take place before or after joining to the core.

Figure 2A:
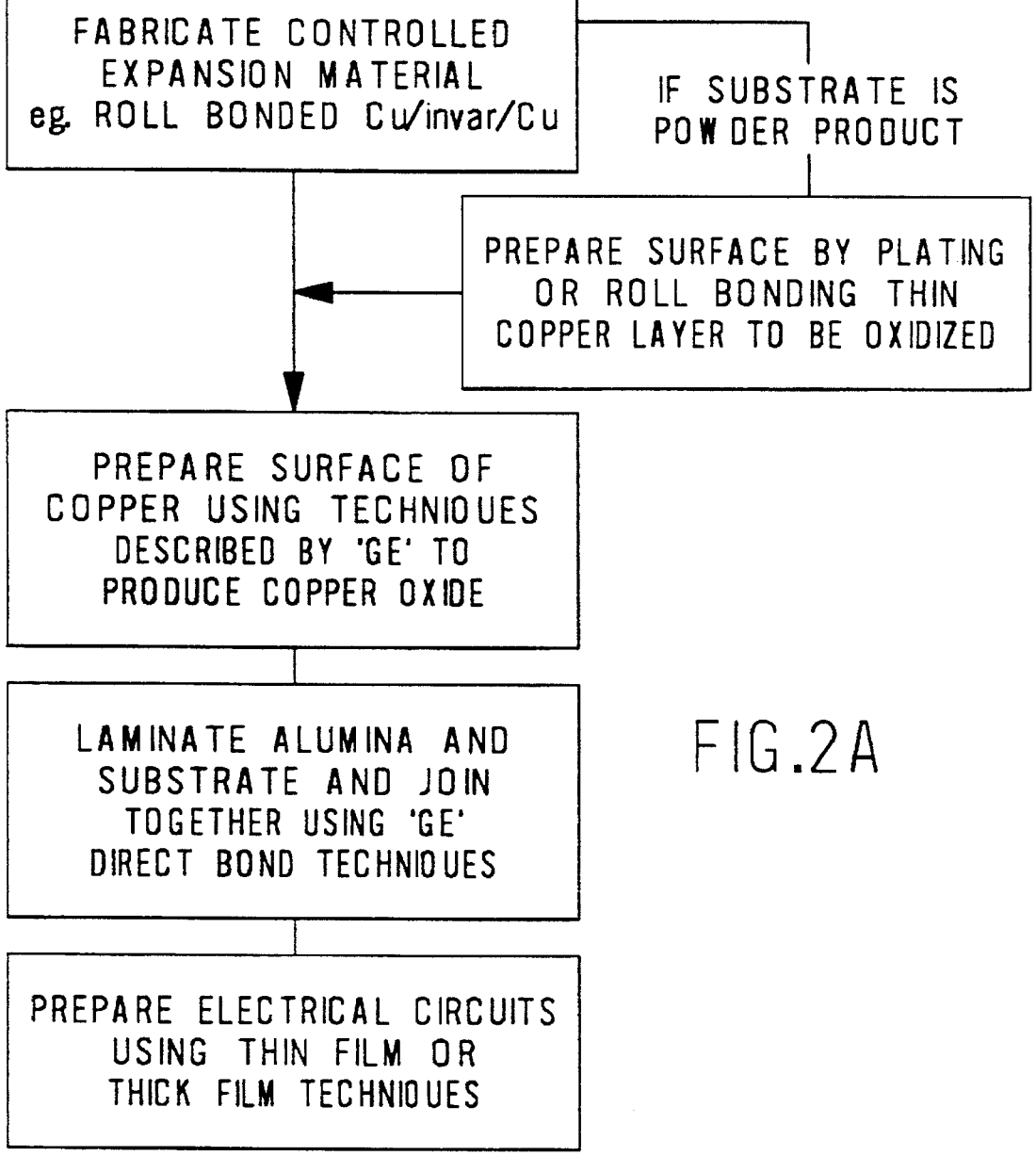
FIGS. 2a and 2b are flow diagrams illustrating the processing steps utilized to provide the substrate in accordance with two embodiments of the present invention.

Referring first to FIG. 2a, there is shown a process flow diagram of the processing steps required to produce substrates in accordance with the present invention using copper eutectic direct bonding of ceramic to controlled expansion substrates.

Initially, the controlled expansion material is fabricated in known manner, such as by roll bonding, powder metallurgy and the like to prepare a substrate of Cu/Invar/Cu. If the substrate is formed of powdered material, the surface thereof is prepared by plating or roll bonding a thin layer of copper thereon which is to be later oxidized. The copper surface is then prepared using the techniques of the above noted General Electric Co. patents to produce a copper oxide on the substrate surface. Alumina is then laminated to the substrate and the lamina are joined together by direct bonding techniques. The joined laminated substrates then prepared for formation of electrical circuits thereon using standard thin film techniques, thick film techniques or other appropriate electric circuit forming techniques.

Figure 2B:
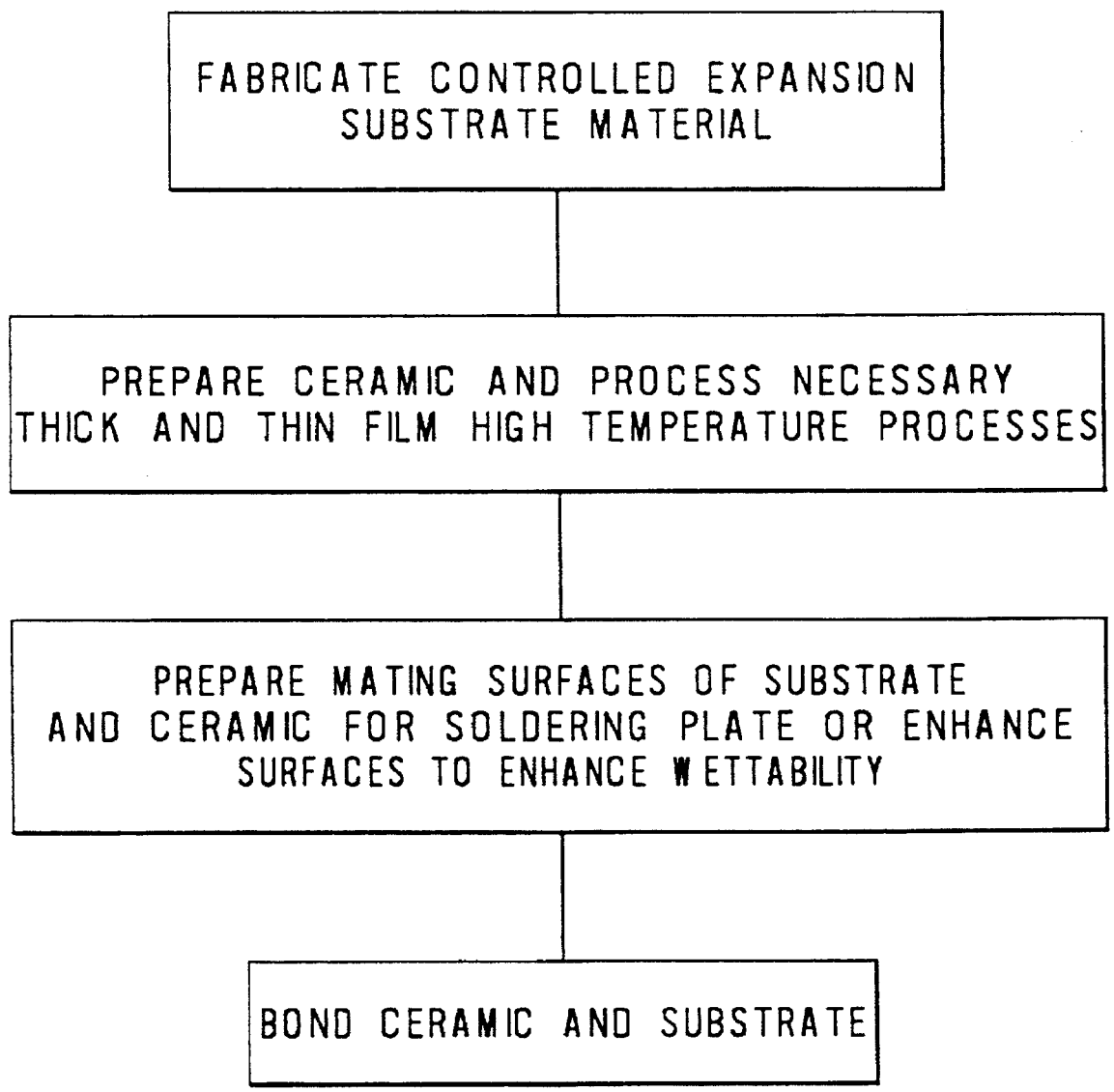

Referring now to FIG. 2b, there is shown a flow diagram showing the processing steps required when using adhesive or soldering to bond the ceramic substrate to the controlled expansion material.

Initially, the controlled expansion substrate is fabricated as in the embodiment of FIG. 2a. The ceramic substrate is the formed and all required thin and/or thick film processing thereon is provided. The mating surfaces of the two substrates are then prepared for soldering and the surface of the ceramic substrate is plated or enhanced to ensure wettability. The substrates are then bonded together by an appropriate joining technique.

The following is an example of a preferred embodiment showing formation of substrates in accordance with the present invention:

EXAMPLE 1

Figure 1:
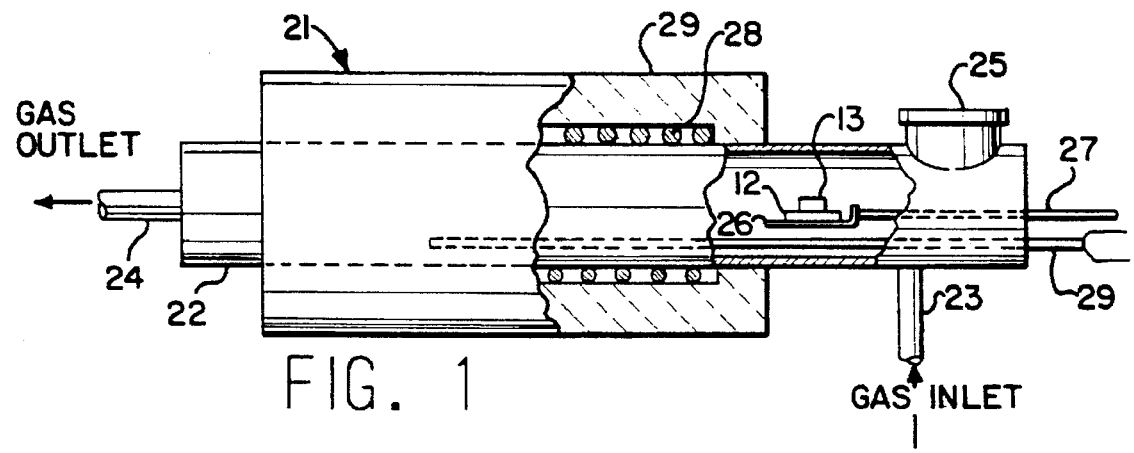
FIG. 1 is a schematic illustration of a horizontal furnace which can be used to provide a substrate in accordance with the present invention.

Utilizing a system of the type set forth in FIG. 6 of U.S. Pat. No. 3,993,411 and FIG. 1 herein, there was provided a clad metal core 12 of copper/invar/copper with layer thicknesses as in Example 1 and having a TCE closely approximating that of the aluminum oxide ceramic material 13 to be bonded thereto positioned on the holder 26. The ceramic material 13 overlay the core 12. These materials were introduced into the quartz tube 22 through the opening 25 which was then sealed by suitable stopper means.

The quartz tube 22 was then purged with a reactive gas flow of approximately 4 cubic feet per hour, for example. As used herein, reactive gas flow or atmosphere means a mixture of an inert gas such as argon, helium or nitrogen, for example, with a controlled minor amount of a reactive gas, such as oxygen, a phosphorus-containing gas such as phosphine, for example, or a sulfur-containing gas such as hydrogen sulfide, for example. The amount or reactive gas in the total gas flow is dependent, in part, on the materials to be bonded and the thickness of the materials, in a manner more fully described hereinbelow. In general, however, the partial pressure of the reactive gas must exceed the equilibrium partial pressure of the reactive gas in the metal at or above the eutectic temperature. For example, when bonding copper members to refractory members in a reactive atmosphere including oxygen, the partial pressure of oxygen must be above $1.5 \times 10^{-6}$ atmosphere at the copper-copper oxide eutectic temperature of 1065° C.

After purging the quartz tube, the furnace was then brought to a temperature sufficient to form the copper-copper oxide eutectic liquidus or melt at the metal-substrate interface. For example, for a copper-alumina bond with oxygen as the reactive gas, the temperature of the furnace was brought to between approximately 1065° and 1075° C. Within this range of temperatures, a copper-copper oxide eutectic formed on the copper member 13. This eutectic melt then wetted the copper and the alumina to form a tenacious bond therebetween.

In general, the time required to form this eutectic melt will be that time necessary to form a good bond without oxidizing the copper. A more detailed relationship between copper thickness and time at an elevated temperature of between 1065° and 1075° C. is presented in Table II of the above noted U.S. Pat. No. 3,993,411.

Table II noted above illustrates the relationship between copper thickness, non-metallic refractory material thickness and firing time in the furnace, i.e., the time at which the metal-nonmetal materials remain in the furnace. From this table, it is readily apparent that the firing time increases with the metal thickness, although there does not appear to be a linear relationship between the two.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A method of forming a substrate which includes the steps of:
   (a) providing a first layer of ceramic material;
   (b) providing a solid metal core having a coefficient of thermal expansion substantially the same as that of said first layer and having at least one copper surface, the ratio of the thickness of the metal core to that of the layer of ceramic material being n:1 where n is a number equal to or greater than about one;
   (c) forming a copper-copper oxide eutectic material on said copper surface; and
   (d) joining said first layer to said copper surface of said solid metal core by bonding said copper-copper oxide eutectic material to said first layer and to said copper surface.

2. The method of claim 1 wherein said ceramic material is taken from the class consisting of alumina, beryllium oxide, aluminum nitride and silicon carbide.

3. The method of claim 1 wherein said metal core is taken from the class consisting of Cu/Invar/Cu, Cu-W, Ag-Mo, Ag-W, Ag/Invar/Ag, Al-Si, Cu/Mo/Cu, Cu/Kovar/Cu, SiC-Cu and Ni-Fe alloys having from about 20% Ni to about 80% Ni, said metal core having a layer of copper surface material thereon.

4. The method of claim 3 wherein said ceramic material is taken from the class consisting of alumina, beryllium oxide, aluminum nitride and silicon carbide.

5. The method of claim 1 further including providing a second layer of ceramic material having a coefficient of thermal expansion substantially the same as that of said metal core and joining said second layer to a second copper surface of said metal core opposing said first surface by bonding a copper-copper oxide eutectic material to said second layer and to said second copper surface, the ratio of the thickness of the metal core to that of said first and second layers of ceramic material being 1:n:1 where n represents the thickness of said core and is a number equal to or greater than about one.

6. The method of claim 5 wherein said ceramic material is taken from the class consisting of alumina, beryllium oxide, aluminum nitride and silicon carbide.

7. The method of claim 5 wherein said metal core is taken from the class consisting of Cu/Invar/Cu, Cu-W, Ag-Mo, Ag-W, Ag/Invar/Ag, Al-Si, Cu/Mo/Cu, Cu/Kovar/Cu, SiC-Cu and Ni-Fe alloys having from about 20% Ni to about 80% Ni, said metal core having a layer of copper surface material thereon.

8. The method of claim 7 wherein said ceramic material is taken from the class consisting of alumina, beryllium oxide, aluminum nitride and silicon carbide.

* * * * *